United States Patent
Koo et al.

(10) Patent No.: US 12,108,531 B2
(45) Date of Patent: Oct. 1, 2024

(54) CIRCUIT BOARD COMPRISING VIA

(71) Applicant: LG INNOTEK CO., LTD., Seoul (KR)

(72) Inventors: Kyo Hun Koo, Seoul (KR); Jin Hak Lee, Seoul (KR); In Ho Jeong, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 167 days.

(21) Appl. No.: 17/756,541

(22) PCT Filed: Nov. 26, 2020

(86) PCT No.: PCT/KR2020/017003
§ 371 (c)(1),
(2) Date: May 26, 2022

(87) PCT Pub. No.: WO2021/107654
PCT Pub. Date: Jun. 3, 2021

(65) Prior Publication Data
US 2022/0418107 A1   Dec. 29, 2022

(30) Foreign Application Priority Data

Nov. 27, 2019   (KR) .................. 10-2019-0153968

(51) Int. Cl.
*H05K 1/11*   (2006.01)
*H05K 1/02*   (2006.01)
*H05K 3/42*   (2006.01)

(52) U.S. Cl.
CPC .......... *H05K 1/115* (2013.01); *H05K 1/0206* (2013.01); *H05K 1/0218* (2013.01); *H05K 3/424* (2013.01); *H05K 2201/09563* (2013.01)

(58) Field of Classification Search
CPC ...... H05K 1/115; H05K 3/423; H05K 1/0206; H05K 1/0218; H05K 1/111; H05K 3/108;
(Continued)

(56) References Cited

U.S. PATENT DOCUMENTS 6,240,636 B1 *  6/2001  Asai ..................... H05K 3/0038
                                                        29/830
6,486,394 B1 * 11/2002  Schmidt ............... H05K 9/0039
                                                        174/262

(Continued)

FOREIGN PATENT DOCUMENTS

CN      111511105    *   1/2019
JP      2002-76633 A     3/2002

(Continued)

OTHER PUBLICATIONS

International Search Report dated Mar. 17, 2021 in International Application No. PCT/KR2020/017003.

(Continued)

*Primary Examiner* — Timothy J Thompson
*Assistant Examiner* — Michael F McAllister
(74) *Attorney, Agent, or Firm* — Saliwanchik, Lloyd & Eisenschenk

(57) ABSTRACT

A circuit board according to an embodiment includes: an insulating layer including a through hole and a via disposed in the through hole and wherein the via including a first metal layer on an upper surface of the insulating layer and an inner wall of the through hole; and a second metal layer disposed in the through hole, and the an upper surface of the second metal layer includes a protruding portion that does not overlap an upper surface of the insulating layer in a vertical direction and is located higher than the first metal layer.

18 Claims, 9 Drawing Sheets

(58) Field of Classification Search
CPC ........ H05K 3/424; H05K 3/426; H05K 3/427;
H05K 3/4661; H05K 2201/09563; H05K
2201/096; H05K 3/429; H05K 1/112;
H05K 2203/025; H05K 2201/09509;
H05K 2201/09827; H05K 2201/09518;
H05K 2203/1572; H05K 2201/0338;
H05K 2203/1476; H05K 3/425
USPC ........................................................ 174/264
See application file for complete search history.

(56) References Cited

U.S. PATENT DOCUMENTS

| | | | | |
|---|---|---|---|---|
| 6,972,382 | B2* | 12/2005 | Zollo | H05K 3/4623 |
| | | | | 174/262 |
| 9,433,093 | B2* | 8/2016 | Uzoh | H05K 1/115 |
| 9,516,753 | B2* | 12/2016 | Hara | H01L 23/49822 |
| 9,538,664 | B2* | 1/2017 | Yanagisawa | H05K 3/0038 |
| 10,321,566 | B2* | 6/2019 | Hitsuoka | H05K 3/0032 |
| 10,440,835 | B1* | 10/2019 | Grober | H01L 21/486 |
| 10,448,501 | B2 | 10/2019 | Wu | |
| 10,531,577 | B1* | 1/2020 | Grober | H05K 3/429 |
| 11,452,212 | B2* | 9/2022 | Tuominen | H05K 1/115 |
| 2005/0205291 | A1* | 9/2005 | Yamashita | H05K 3/20 |
| | | | | 174/262 |
| 2010/0163297 | A1* | 7/2010 | Kajihara | H05K 3/0032 |
| | | | | 29/846 |
| 2011/0155439 | A1* | 6/2011 | Yamada | H05K 3/4652 |
| | | | | 29/852 |
| 2014/0097013 | A1* | 4/2014 | Hara | H01L 23/49822 |
| | | | | 174/266 |
| 2015/0146393 | A1 | 5/2015 | Uzoh et al. | |
| 2016/0330836 | A1* | 11/2016 | Mizutani | H05K 3/423 |
| 2017/0019994 | A1 | 1/2017 | Wu | |

FOREIGN PATENT DOCUMENTS

| | | |
|---|---|---|
| JP | 2006-332159 A | 12/2006 |
| JP | 2012-49423 A | 3/2012 |
| KR | 10-0965341 B1 | 6/2010 |
| KR | 10-2014-0055331 A | 5/2014 |
| KR | 10-2014-0078199 A | 6/2014 |
| KR | 10-1875943 B1 | 7/2018 |
| KR | 10-1956563 B1 | 3/2019 |
| TW | 201705826 A | 2/2017 |

OTHER PUBLICATIONS

Office Action dated Apr. 25, 2024 in Korean Application No. 10-2019-0153968.
Office Action dated May 3, 2024 in Taiwanese Application No. 109141178.

* cited by examiner (a)

(b)

(c)

(a)

(b)

(a)

(b)

CIRCUIT BOARD COMPRISING VIA

CROSS-REFERENCE TO RELATED APPLICATIONS

This application is the U.S. national stage application of International Patent Application No. PCT/KR2020/017003, filed Nov. 26, 2020, which claims the benefit under 35 U.S.C. § 119 of Korean Application No. 10-2019-0153968, filed Nov. 27, 2019, the disclosures of each of which are incorporated herein by reference in their entirety.

TECHNICAL FIELD

The present invention relates to a printed circuit board and a method of manufacturing the same.

BACKGROUND ART

As miniaturization, weight reduction, and integration of an electronic component are accelerated, a line width of a circuit has been miniaturized. In particular, as a design rule of a semiconductor chip is integrated on a nanometer scale, a circuit line width of a package substrate or a printed circuit board on which the semiconductor chip is mounted has been miniaturized to several micrometers or less.

Various methods have been proposed in order to increase the degree of circuit integration of the printed circuit board, that is, to reduce the circuit line width. For the purpose of inhibiting loss of the circuit line width in an etching step for forming a pattern after copper plating, a semi-additive process (SAP) method and a modified semi-additive process (MSAP) have been proposed.

Then, an embedded trace substrate (hereinafter referred to as "ETS") method for embedding a copper foil in an insulating layer in order to implement a fine circuit pattern has been used in the industry. In the ETS method, instead of forming a copper foil circuit on a surface of the insulating layer, the copper foil circuit is manufactured in an embedded form in the insulating layer, and thus there is no circuit loss due to etching and it is advantageous for miniaturizing the circuit pitch.

Meanwhile, recently, in order to meet a demand for wireless data traffic, efforts have been made to develop an improved 5G (5th generation) communication system or a pre-5G communication system. Here, the 5G communication system uses ultra-high frequency (mmWave) bands (sub 6 GHz, 28 GHz, 38 GHz, or higher frequencies) to achieve high data transfer rates.

In addition, in order to reduce a path loss of radio waves and increase a transmission distance of radio waves in the ultra-high frequency band, in the 5G communication system, integration technologies such as beamforming, massive multi-input multi-output (massive MIMO), and array antennas have been developed. Considering that it may be composed of hundreds of active antennas of wavelengths in the frequency bands, an antenna system becomes large relatively.

Since such an antenna and AP module are patterned or mounted on the printed circuit board, low loss on the printed circuit board is very important. This means that several substrates constituting the active antenna system, that is, an antenna substrate, an antenna power feeding substrate, a transceiver substrate, and a baseband substrate, should be integrated into one compact unit.

Meanwhile, recently, in order to improve heat dissipation characteristics or shielding characteristics, a printed circuit board including a large-area via has been developed. The large-area via may be formed by filling a large-diameter via hole with a metal material. However, it is not easy to fill the inside of the large-diameter via hole with the metal material, and accordingly, a conventional large-area via includes a dimple region that is recessed to be concave in an inner direction of the via hole on one surface thereof. In addition, the dimple region may affect the via hole processing when additional lamination is performed, which affects reliability of the printed circuit board.

DISCLOSURE

Technical Problem

An embodiment provides a printed circuit board including a via having a new structure, and a method of manufacturing the same.

In addition, the embodiment provides a printed circuit board including a via composed of a plurality of via parts disposed in a multi-layered structure inside a via hole, and a method of manufacturing the same.

Technical problems to be solved by the proposed embodiments are not limited to the above-mentioned technical problems, and other technical problems not mentioned may be clearly understood by those skilled in the art to which the embodiments proposed from the following descriptions belong.

Technical Solution

A printed circuit board according to an embodiment includes: an insulating layer including a via hole; and a via disposed in the via hole of the insulating layer, wherein the via includes; a connection portion disposed in the via hole of the insulating layer; a first pad disposed on an upper surface of the insulating layer and an upper surface of the connection portion; and a second pad disposed under a lower surface of the insulating layer and a lower surface of the connection portion, wherein the upper surface of the connection portion includes a concave shape in a downward direction, the lower surface of the connection portion includes a concave shape in an upward direction, a lower surface of the first pad includes a convex shape corresponding to the upper surface of the connection portion, and an upper surface of the second pad includes a convex shape corresponding to the lower surface of the connection portion.

In addition, the printed circuit board includes a seed layer disposed between an inner wall of the via hole and the connection portion, between the insulating layer and the first pad, and between the insulating layer and the second pad.

In addition, a first portion of the upper surface of the connection portion is positioned lower than the upper surface of the insulating layer, and a first portion of the lower surface of the connection portion is positioned higher than the lower surface of the insulating layer.

In addition, a second portion of the upper surface of the connection portion is positioned higher than the upper surface of the insulating layer, and a second portion of the lower surface of the connection portion is positioned lower than the lower surface of the insulating layer.

In addition, the second portion of the upper surface of the connection portion is positioned higher than the lower surface of the first pad, and the second portion of the lower surface of the connection portion is positioned lower than the upper surface of the second pad.

In addition, a distance from the upper surface of the insulating layer to the first portion of the upper surface of the connection portion has a range of 5% to 40% of a thickness of the insulating layer, and a distance from the lower surface of the insulating layer to the first portion of the lower surface of the connection portion has a range of 5% to 40% of the thickness of the insulating layer.

In addition, the connection portion includes an X-shape.

In addition, the second portion of the upper surface of the connection portion is positioned between an upper surface of the seed layer disposed on the upper surface of the insulating layer and the lower surface of the first pad, and the second portion of the lower surface of the connection portion is positioned between a lower surface of the seed layer disposed on the lower surface of the insulating layer and the upper surface of the second pad.

In addition, each of the first pad and the second pad includes a first region disposed on the upper surface or the lower surface of the insulating layer, and a second region disposed in the via hole and including a convex portion corresponding to the upper surface or the lower surface of the connection portion.

Meanwhile, a printed circuit board according to an embodiment includes: a first insulating layer including a first via hole; a second insulating layer including a second via hole and disposed on the first insulating layer; a first via disposed in the first via hole of the first insulating layer; and a second via disposed in the second via hole of the second insulating layer, wherein the second via includes a first connection portion having a lower surface in contact with an upper surface of the first via and an upper surface that is concave in a downward direction, and a first pad disposed on the second insulating layer and having a lower surface that is convex in the downward direction so as to correspond to the upper surface of the first connection portion.

In addition, the printed circuit board includes: a third insulating layer including a third via hole and disposed under the first insulating layer; and a third via disposed in the third via hole of the third insulating layer, wherein the third via includes a second connection portion of which an upper surface is in contact with a lower surface of the first via, and of which a lower surface is concave in an upward direction, and a second pad disposed under the third insulating layer and having an upper surface that is convex in the upward direction so as to correspond to the lower surface of the first connection portion.

In addition, a first portion of the upper surface of the first connection portion is positioned lower than an upper surface of the second insulating layer, and a second portion of the upper surface of the first connection portion is positioned higher than the upper surface of the second insulating layer and the lower surface of the first pad.

In addition, a first portion of the lower surface of the second connection portion is positioned higher than a lower surface of the third insulating layer, and a second portion of the lower surface of the second connection portion is positioned lower than the lower surface of the third insulating layer and the upper surface of the second pad.

Meanwhile, a method for manufacturing a printed circuit board according to an embodiment includes preparing an insulating layer, forming a via hole in the insulating layer, forming a seed layer on a surface of the insulating layer and an inner wall of the via hole, disposing a first mask having a first opening region that exposes the via hole on the seed layer, forming a connection portion of a via that fills a part of the via hole by performing plating based on the seed layer, removing the first mask, disposing a second mask having a second opening region that exposes the connection portion on the seed layer, forming a pad protruding on the surface of the insulating layer while filling the remaining part of the via hole by performing plating based on the seed layer, and removing the second mask, wherein a width of the first opening region is smaller than that of an upper portion of the via hole, an upper surface of the connection portion includes a concave shape in a downward direction, and a lower surface of the pad includes a convex shape corresponding to the upper surface of the connection portion.

In addition, the width of the first opening region of the first mask has a level of 80% to 95% of the upper width of the via hole.

In addition, the first portion of the upper surface of the connection portion is positioned lower than the upper surface of the insulating layer, and the second portion of the upper surface of the connection portion is positioned higher than the upper surface of the insulating layer.

In addition, the second portion of the upper surface of the connection portion is positioned higher than the lower surface of the pad.

Advantageous Effects

According to the present embodiment, in case of a conventional large-area via, a restriction on plating of a large-diameter via hole occurs, but the restriction on plating the large-diameter via hole of the large-area via may be destroyed by changing a plating method, and accordingly, plating of the large-diameter via hole may be stably implemented. In addition, according to the present embodiment, it is possible to ensure uniformity of plating of a via compared to the related art, and quality reliability according to improvement of laser quality after additional lamination may be ensured.

In addition, in the related art, there was a limit ratio in a method for stably implementing of plating inside a via hole between a thickness of an insulating layer and a size of the via hole, but according to the present embodiment, it is possible to break the design constraint for implementing a highly reliable plating state inside the via hole, and accordingly, it is possible to improve the degree of freedom in design. Further, according to the embodiment, as the size of the via is increased, it is possible to completely shield the interference between circuits generated in a region in which the circuits are connected, and it is possible to improve heat dissipation characteristics in a region in which a function of heat dissipation is required.

BEST MODE

Figure 1A:
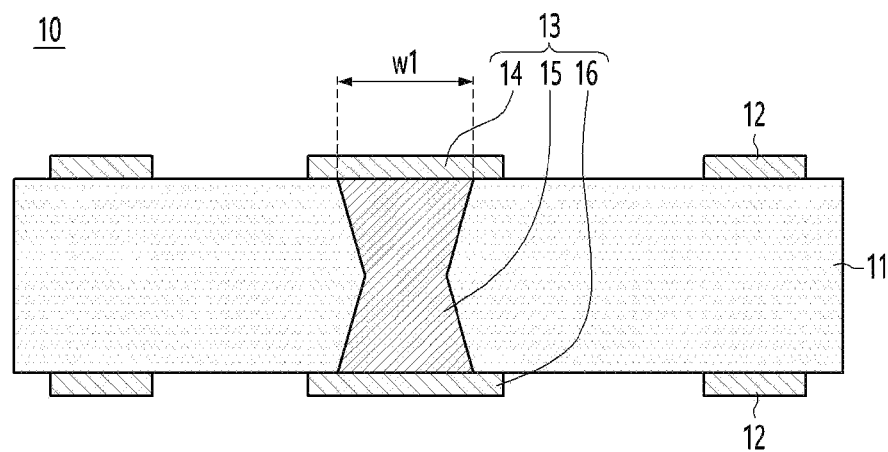
FIGS. 1A and 1B are views showing a printed circuit board according to a comparative example.

Hereinafter, the embodiment disclosed in the present specification will be described in detail with reference to the accompanying drawings, but the same or similar components are designated by the same reference numerals regardless of drawing numbers, and repeated description thereof will be omitted. The component suffixes "module" and "part" used in the following description are given or mixed together only considering the ease of creating the specification, and have no meanings or roles that are distinguished from each other by themselves. In addition, in describing the embodiments disclosed in the present specification, when it is determined that detailed descriptions of a related well-known art unnecessarily obscure gist of the embodiments disclosed in the present specification, the detailed description thereof will be omitted. Further, the accompanying drawings are merely for facilitating understanding of the embodiments disclosed in the present specification, the technological scope disclosed in the present specification is not limited by the accompanying drawings, and it should be understood as including all modifications, equivalents and alternatives that fall within the spirit and scope of the present invention.

It will be understood that, although the terms "first," "second," etc. may be used herein to describe various elements, these elements should not be limited by these terms. These terms are only used to distinguish one element from another.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between," "adjacent" versus "directly adjacent," etc.).

As used herein, the singular forms "a," "an" and "the" are intended to include the plural forms as well, unless the context clearly indicates otherwise.

It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Hereinafter, embodiments of the present invention will be described in detail with reference to the accompanying drawings.

Figure 1B:
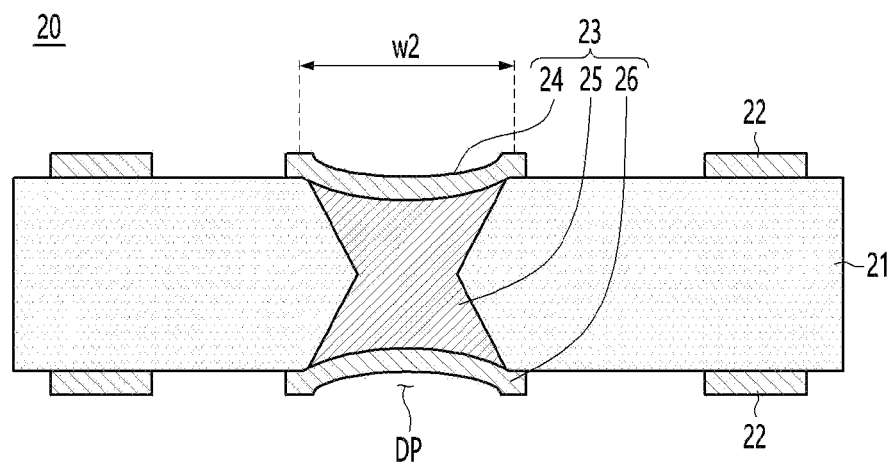

FIGS. 1A and 1B are views showing a printed circuit board according to a comparative example.

Referring to 1A, a printed circuit board 10 according to the comparative example includes an insulating layer 11.

In addition, the printed circuit board 10 includes a circuit pattern 12 and a via 13.

The circuit pattern 12 is disposed on at least one of upper and lower surfaces of the insulating layer 11. In addition, the via 13 passes through the insulating layer 11 and connects circuit patterns disposed on different layers.

At this time, the via 13 includes a first pad 14 disposed on the upper surface of the insulating layer 11, a second pad 16 disposed on the lower surface of the insulating layer 11, and a connection portion 15 disposed in the insulating layer 11 and connecting the first pad 14 and the second pad 16.

The first pad 14 and the second pad 16 may also be referred to as circuit patterns 12 disposed on the upper and lower surfaces of the insulating layer 11.

The connection portion 15 is formed by filling the inside of a via hole (not shown) formed in the insulating layer 11 with a metal material. Preferably, the connection portion 15 is formed by plating the inside of the via hole with the metal material.

The connection portion 15 has a shape in which a width gradually increases toward upper and lower portions around a central inflection point. For example, the connection portion 15 has an hourglass shape.

An upper surface or a lower surface of the connection portion 15 has a first width w1. For example, the first width w1 is 80 μm or less. That is, the connection portion 15 is formed by filling a via hole formed to have a diameter of 80 μm or less in an upper or lower region with the metal material. In this case, the upper and lower surfaces of the connection portion 15, an upper surface of the first pad 14, and a lower surface of the second pad 16 are substantially planar. That is, the upper and lower surfaces of the connection portion 15, the upper surface of the first pad 14, and the lower surface of the second pad 16 lie on the same plane as the upper or lower surface of the insulating layer 11.

Meanwhile, recently, in order to improve performance of a via serving heat dissipation, shielding, and signal transmission, the size of the via hole has been greatly increased, and accordingly, the size of the via hole or the via is also increasing.

Referring to FIG. 1B, a printed circuit board 20 according to a comparative example includes an insulating layer 21.

In addition, the printed circuit board 20 includes a circuit pattern 22 and a via 23.

The circuit pattern 22 is disposed on at least one of upper and lower surfaces of the insulating layer 21. In addition, the via 23 passes through the insulating layer 21 and connects circuit patterns disposed on different layers.

At this time, the via 23 includes a first pad 24 disposed on the upper surface of the insulating layer 21, a second pad 26 disposed on the lower surface of the insulating layer 21, and a connection portion 25 disposed in the insulating layer 21 and connecting the first pad 24 and the second pad 26.

The first pad 24 and the second pad 26 may also be referred to as circuit patterns 22 disposed on the upper and lower surfaces of the insulating layer 21.

The connection portion 25 is formed by filling the inside of a via hole (not shown) formed in the insulating layer 21 with a metal material. Preferably, the connection portion 25 is formed by plating the inside of the via hole with the metal material.

An upper surface or a lower surface of the connection portion 25 has a second width w2. For example, the second width w2 may be greater than or equal to 100 μm, which is greater than the first width w1. That is, the connection portion 25 is formed by filling a via hole formed to have a diameter of 100 μm or more in an upper or lower region with the metal material. In this case, the upper and lower surfaces of the connection portion 25, an upper surface of the first pad 24, and a lower surface of the second pad 26 are substantially curved. That is, the upper and lower surfaces of the connection portion 25, the upper surface of the first pad 24, and the lower surface of the second pad 26 may have a concave shape in an upward direction or a downward direction. That is, the via 23 in the comparative example may include a dimple region.

That is, when the size of the via hole is processed to a diameter of 100 μm or more, the via fill plating is not performed smoothly, and thus a concave dimple region DP as described above is generated.

FIGS. 2(a) to 2(c) are views showing various embodiments of a shape or a size of a via.

Figure 2:
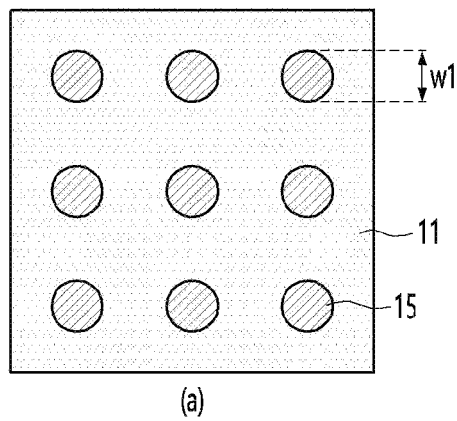
FIGS. 2(a) to 2(c) are views showing various embodiments of a shape or a size of a via.
Figure 2:
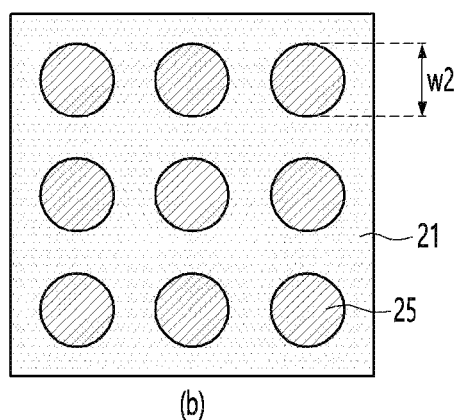
Figure 2:
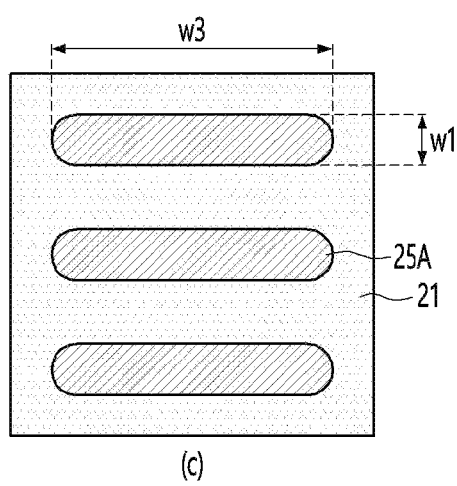

Referring to FIG. 2, as shown in (a), the connection portion 15 may have a circular cross-sectional shape having the first width w1 of 80 μm or less in diameter.

As shown in (b) of FIG. 2, the connection portion 25 may have a circular cross-sectional shape having the second width w2 of 100 μm or more in diameter.

In addition, as shown in (c) of FIG. 2, a connection portion 25A may have an elliptical cross-sectional shape or a bar shape having a diameter of the first width w1 in a first direction and a third width w3 with a diameter of 100 μm or more in a second direction.

FIGS. 3(a) and 3(b) are views for describing a dimple region shown in a comparative example.

Figure 3:
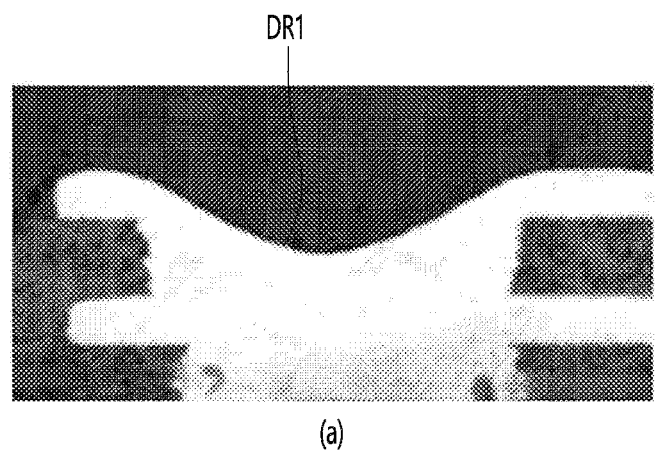
FIGS. 3(a) and 3(b) are views for describing a dimple region shown in a comparative example.
Figure 3:
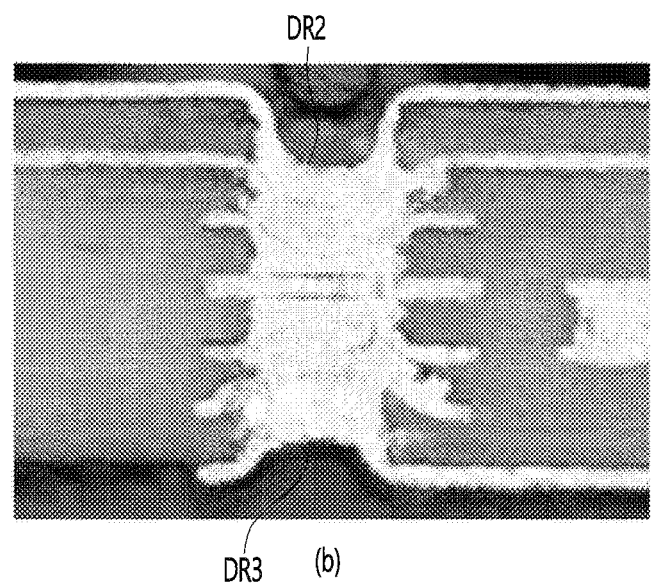

Referring to FIG. 3, in case of a via having a relatively small size as in (a) of FIG. 2, plating is smoothly performed over the entire region of a via hole.

However, as shown in (b) or (c) of FIG. 2, when a diameter of the via hole exceeds 100 μm, the via fill plating is not smoothly performed, and thus a dimple region DR1 that is concave in a downward direction exists at an upper portion of the via as shown in (a) of FIG. 3, or dimple regions DR2 and DR3 that are concave in downward and upward directions exist in the upper and lower portions of the via, respectively as shown in (b) of FIG. 3.

In addition, when a depth of the dimple regions DR1, DR2, and DR3 is 10 μm or more, it may be determined as defective and may not be used, or when an additional lamination proceeds after a core layer of the printed circuit board is formed, there is a problem that processing of the via hole in the corresponding region does not proceed smoothly.

Meanwhile, recently, in order to improve performance of a via serving heat dissipation, shielding, and signal transmission, the size of the via hole has been greatly increased, and accordingly, the size of the via hole or the via is also increasing. In the embodiment, even in a large-area via of 10 μm or more as described above, a printed circuit board having a new structure capable of uniformly plating the entire region of the via hole and removing the dimple region of the via accordingly and its manufacturing method are provided.

Figure 4:
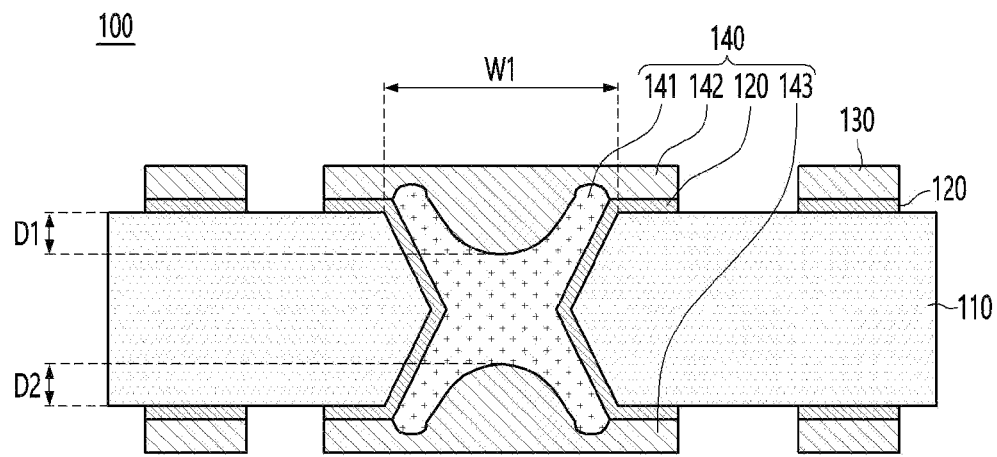
FIG. 4 is a view showing a printed circuit board according to a first embodiment.
Figure 5:
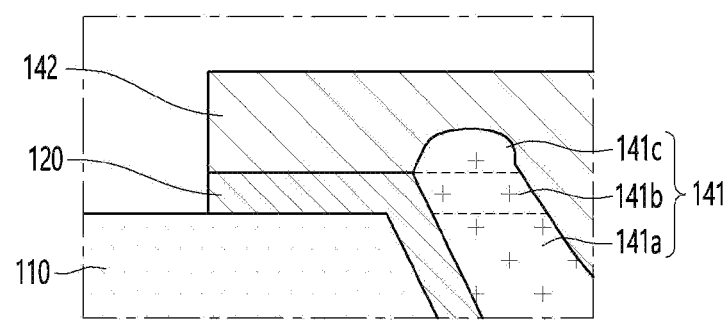
FIG. 5 is an enlarged view of a via of the printed circuit board of FIG. 4.

FIG. 4 is a view showing a printed circuit board according to a first embodiment, and FIG. 5 is an enlarged view of a via of the printed circuit board of FIG. 4.

FIGS. 4 and 5, a printed circuit board 100 includes an insulating layer 110, a seed layer 120, a circuit pattern 130, and a via 140.

The insulating layer 110 is a substrate on which an electrical circuit capable of changing wirings is disposed, and may include all of printing, a wiring plate, and an insulating substrate which are made of an insulating material capable of forming a circuit pattern on a surface thereof.

When the printed circuit board 100 has a plurality of stacked structures, the insulating layer 110 may refer to an insulating layer disposed at a center of a plurality of insulating layers having the plurality of stacked structures, but the embodiment is limited thereto. Preferably, the insulating layer 110 may refer to an insulating layer in which a plated through hole (PTH) via is formed among the plurality of insulating layers.

For example, the insulating layer 110 may be rigid or flexible. For example, the insulating layer 110 may include glass or plastic. Specifically, the insulating layer 110 may include a chemically tempered/semi-tempered glass, such as soda lime glass, aluminosilicate glass, etc., a tempered or flexible plastic such as polyimide (PI), polyethylene terephthalate (PET), propylene glycol (PPG), polycarbonate (PC), etc., or sapphire.

Further, the insulating layer 110 may include an optically isotropic film. As an example, the insulating layer 110 may include cyclic olefin copolymer (COC), cyclic olefin polymer (COP), optically isotropic PC, optically isotropic polymethylmethacrylate (PMMA), or the like.

In addition, the insulating layer 110 may be partially bent while having a curved surface. That is, the insulating layer 110 may partially have a plane and may partially be bent while having a curved surface. Specifically, an end portion of the insulating layer 110 may be bent while having a curved surface, or bent or crooked while having a surface with a random curvature.

In addition, the insulating layer 110 may be a flexible substrate having flexibility. Further, the insulating layer 110 may be a curved or bent substrate. At this point, the insulating layer 110 may form a wiring layout for electrical wirings which connect circuit components based on a circuit design, and electrical conductors may be disposed on an insulating material. Further, electrical components may be mounted on the insulating layer 110, and the insulating layer 110 may form wirings configured to connect the electrical components to make a circuit, and may mechanically fix the components besides functioning to electrically connect the components.

The circuit pattern 130 may be disposed at a surface of the insulating layer 110. For example, a plurality of circuit patterns 130 may be disposed to be spaced apart from each other at a predetermined distance on an upper surface of the insulating layer 110. For example, the plurality of circuit patterns 130 may be disposed to be spaced apart from each other at a predetermined distance on a lower surface of the insulating layer 110.

The insulating layer 110 may have a thickness between 20 μm and 500 μm. Preferably, the insulating layer 110 may have a thickness between 40 μm and 400 μm. More preferably, the insulating layer 110 may have a thickness between 60 μm and 25 μm. When the thickness of the insulating layer 110 is less than 20 μm, it may be difficult to form the circuit pattern 130 on the surface of the insulating layer 110. When the thickness of the insulating layer 110 exceeds 500 μm, the overall thickness of the printed circuit board 100 may increase.

Meanwhile, the circuit pattern 130 may be a wiring for transmitting an electrical signal, and may be formed of a metal material having high electrical conductivity. For this, the circuit pattern 130 may be formed of at least one metal material selected from among gold (Au), silver (Ag), platinum (Pt), titanium (Ti), tin (Sn), copper (Cu), and zinc (Zn). In addition, the circuit pattern 130 may be formed of paste or solder paste including at least one metal material selected from among gold (Au), silver (Ag), platinum (Pt), titanium (Ti), tin (Sn), copper (Cu), and zinc (Zn), which are excellent in bonding strength. Preferably, the circuit pattern 130 may be formed of copper (Cu) having high electrical conductivity and a relatively low cost.

The circuit pattern 130 may be formed by a general process of manufacturing a PCB, such as an additive process, a subtractive process, a modified semi additive process (MSAP), a semi additive process (SAP), etc., and detailed descriptions thereof will be omitted herein.

Meanwhile, the seed layer 120 may be disposed between the insulating layer 110 and the circuit pattern 130. The seed layer 120 may be selectively omitted. That is, when the circuit pattern 130 is formed by electrolytic plating, the seed layer 120 may be disposed between the insulating layer 110 and the circuit pattern 130. In addition, when the circuit pattern 130 is formed by electroless plating, the seed layer 120 may be omitted.

Accordingly, it may be referred to as a circuit pattern layer including the circuit pattern 130 and the seed layer 120. The circuit pattern layer may have a range from 10 µm to 25 µm. Preferably, when the circuit pattern layer includes the circuit pattern 130 and the seed layer 120, a sum of thicknesses of the circuit pattern 130 and the seed layer 120 may be in the range from 10 µm to 25 µm. In addition, when the circuit pattern layer includes only the circuit pattern 130, the thickness of the circuit pattern 130 may range from 10 µm to 25 µm.

The via 140 may be disposed in the insulating layer 110. The via 140 may be disposed passing through the insulating layer 110. Preferably, the via 140 may connect the circuit patterns 130 disposed on the upper and lower surfaces of the insulating layer 110 to each other. In this case, the circuit patterns connected by the via 140 may be any one of a signal pattern for an electrical signal transmission function, a shielding pattern for a signal shielding function, and a heat radiation pattern for a heat radiation function, but the embodiment is not limited thereto.

The via 140 may be disposed passing through the upper and lower surfaces of the insulating layer 110. The via 140 may electrically connect the circuit pattern 130 to be disposed on the upper surface of the insulating layer 110 and the circuit pattern to be disposed on the lower surface of the insulating layer 110.

The via 140 may include a connection portion 141, a first pad 142 and a second pad 143.

The first pad 142 and the second pad 143 may be disposed on the upper surface and the lower surface of the insulating layer 110, respectively. Preferably, the first pad 142 and the second pad 143 may be one of the circuit pattern layers. In other words, the first pad 142 and the second pad 143 may refer to circuit patterns connected to the connection portion 141 of the via 140 among the circuit patterns 130 disposed on the upper and lower surfaces of the insulating layer 110.

The connection portion 141 having one end connected to the first pad 142 and the other end connected to the second pad 143 may be disposed in the insulating layer 110.

The connection portion 141 may be disposed in the via hole formed in the insulating layer 110. Preferably, the connection portion 141 may be formed by filling a part of the via hole formed in the insulating layer 110.

That is, the connection portion 141 may be formed by filling only a part of the via hole formed in the insulating layer 110, not the entire via hole.

Accordingly, the connection portion 141 may have a curved surface rather than a flat surface. Preferably, the upper surface of the connection portion 141 may have a concave shape in a downward direction. Further, the lower surface of the connection portion 141 may have a concave shape in an upward direction. Accordingly, a length of the upper surface of the connection portion 141 may be greater than the upper width of the via hole formed in the insulating layer 110. That is, the upper surface of the connection portion 141 may have a curved surface, and accordingly, the length of the upper surface of the connection portion 141 may be greater than the upper width of the via hole.

A part of the upper surface of the connection portion 141 may be positioned lower than the upper surface of the insulating layer 110. For example, the central region of the upper surface of the connection portion 141 may be positioned lower than the upper surface of the insulating layer 110. That is, the connection portion 141 may have a concave portion formed on the upper surface thereof. Accordingly, a length of the lower surface of the connection portion 141 may be larger than the lower width of the via hole formed in the insulating layer 110. That is, the lower surface of the connection portion 141 may have a curved surface, and accordingly, the length of the lower surface of the connection portion 141 may be greater than the lower width of the via hole.

In addition, a part of the lower surface of the connection portion 141 may be positioned higher than the lower surface of the insulating layer 110. For example, the central region of the lower surface of the connection portion 141 may be positioned higher than the lower surface of the insulating layer 110. That is, the connection portion 141 may have a concave portion formed on the lower surface thereof.

Accordingly, the connection portion 141 may have the concave portion formed on the upper surface and the lower surface thereof, respectively, and may have an 'X' shape as a whole.

Specifically, the via hole may include a first region positioned at the center of the insulating layer 110, a second region positioned above the insulating layer 110 on the first region, and a third region positioned below the insulating layer 110 below the first region. In addition, the entire region of the first region of the via hole may be filled by the connection portion 141. On the contrary, only a partial region of the second region and the third region of the via hole may be filled by the connection portion 141.

Meanwhile, the concave portion formed on the upper surface of the connection portion 141 may be formed to have a first depth D1 from the upper surface of the insulating layer 110. In addition, the concave portion formed on the lower surface of the connection portion 141 may be formed to have a second depth D2 from the lower surface of the insulating layer 110.

In this case, the first depth D1 may be the same as the second depth D2. For example, the first depth D1 may be 0.95 times to 1.05 times the second depth D2.

The first depth D1 may have a level of 5% to 40% of a thickness of the insulating layer 110. For example, the first depth D1 may have a level of 10% to 20% of the thickness of the insulating layer 110. When the first depth D1 is smaller than 5% of the thickness of the insulating layer 110, the thickness of the protruding region of the connection portion 141 to be described later increases, and accordingly, the thickness of the first pad 142 may be increased. In addition, when the first depth D1 is larger than 40% of the thickness of the insulating layer 110, a dimple region may occur in a process of forming the first pad 142 later.

The second depth D2 may have a thickness of 5% to 40% of the thickness of the insulating layer 110. For example, the second depth D2 may have a thickness of 10% to 20% of the thickness of the insulating layer 110. When the second depth D2 is smaller than 5% of the thickness of the insulating layer 110, the thickness of the protruding region of the connection portion 141 to be described later increases, and accordingly, the thickness of the second pad 143 may be increased. In addition, when the second depth D2 is larger than 40% of the thickness of the insulating layer 110, a dimple region may occur in a process of forming the second pad 143 later.

Meanwhile, the first pad 142 may be disposed on the upper surface of the insulating layer 110.

Preferably, the seed layer 120 may be additionally disposed between the first pad 142 and the upper surface of the insulating layer 110. The seed layer 120 may be disposed between the first pad 142 and the upper surface of the insulating layer 110. Further, the seed layer 120 may be disposed on an inner wall of the via hole. Preferably, the seed layer 120 may be disposed between the inner wall of the via hole and a side surface of the connection portion 141.

A lower surface of the first pad 142 may be in contact with the upper surface of the connection portion 141. Accordingly, the lower surface of the first pad 142 may have a shape corresponding to the upper surface of the connection portion 141. Specifically, the lower surface of the first pad 142 may be a curved surface having a curvature corresponding to the upper surface of the connection portion 141. For example, the first pad 142 may have a convex portion corresponding to a concave portion formed on the upper surface of the connection portion 141.

Accordingly, at least a part of the lower surface of the first pad 142 may be positioned lower than an upper surface of the seed layer 120. For example, a part of the lower surface of the first pad 142 may be positioned lower than the upper surface of the insulating layer 110. For example, a part of the lower surface of the first pad 142 may be positioned lower than the upper surface of the connection portion 141. For example, a part of the lower surface of the first pad 142 may be positioned lower than an edge of the upper surface of the connection portion 141. Specifically, a center portion of the lower surface of the first pad 142 may be positioned lower than the edge portion of the upper surface of the connection portion 141.

Accordingly, a part of the upper surface of the connection portion 141 may be positioned higher than a part of the lower surface of the first pad 142. In addition, another part of the upper surface of the connection portion 141 may be positioned lower than another part of the lower surface of the first pad 142.

Meanwhile, the second pad 143 may be disposed on the lower surface of the insulating layer 110.

Preferably, the seed layer 120 may be additionally disposed between the second pad 143 and the lower surface of the insulating layer 110. The seed layer 120 may be disposed between the second pad 143 and the lower surface of the insulating layer 110.

An upper surface of the second pad 143 may be in contact with the lower surface of the connection portion 141. Accordingly, the upper surface of the second pad 143 may have a shape corresponding to the lower surface of the connection portion 141. Specifically, the upper surface of the second pad 143 may be a curved surface having a curvature corresponding to the lower surface of the connection portion 141. For example, the second pad 143 may have a convex portion corresponding to a concave portion formed on the lower surface of the connection portion 141.

Accordingly, at least a part of the upper surface of the second pad 143 may be positioned higher than a lower surface of the seed layer 120. For example, a part of the upper surface of the second pad 142 may be positioned higher than the lower surface of the insulating layer 110. For example, a part of the upper surface of the second pad 143 may be positioned higher than the lower surface of the connection portion 141. For example, a part of a lower surface of the second pad 143 may be positioned higher than an edge of the lower surface of the connection portion 141. Specifically, a center portion of the upper surface of the second pad 143 may be positioned higher than the edge portion of the lower surface of the connection portion 142.

Accordingly, a part of the lower surface of the connection portion 141 may be positioned lower than a part of the upper surface of the second pad 143. In addition, another part of the lower surface of the connection portion 141 may be positioned higher than another part of the upper surface of the second pad 143.

In the embodiment as described above, in a process of forming the via 140, the via hole formed in the insulating layer 110 is not filled at once, but after forming the connection portion 141 that fills a part of the via hole as described above, the first pad 142 and the second pad 143 that protrude respectively from the upper and lower surfaces of the insulating layer 110 are formed while filling the remaining part of the via hole.

According to the present embodiment, in case of a conventional large-area via, a restriction on plating of a large-diameter via hole occurs, but the restriction on plating the large-diameter via hole of the large-area via may be destroyed by changing a plating method, and accordingly, plating of the large-diameter via hole may be stably implemented. In addition, according to the present embodiment, it is possible to ensure uniformity of plating of a via compared to the related art, and quality reliability according to improvement of laser quality after additional lamination may be ensured.

In addition, in the related art, there was a limit ratio in a method for stably implementing of plating inside a via hole between a thickness of an insulating layer and a size of the via hole, but according to the present embodiment, it is possible to break the design constraint for implementing a highly reliable plating state inside the via hole, and accordingly, it is possible to improve the degree of freedom in design. Further, according to the embodiment, as the size of the via is increased, it is possible to completely shield the interference between circuits generated in a region in which the circuits are connected, and it is possible to improve heat dissipation characteristics in a region in which a function of heat dissipation is required.

Meanwhile, as shown in FIG. 5, a part of the upper surface of the connection portion 141 may be positioned higher than the upper surface of the insulating layer 110. For example, a part of the upper surface of the connection portion 141 may be positioned higher than the upper surface of the seed layer 120.

That is, the connection portion 141 may include a first region 141a disposed in the via hole formed in the insulating layer 110, a second region 141b disposed on the first region 141a and disposed between the seed layer 120, and a third region 141c positioned on the second region 141b and having an upper surface higher than the upper surface of the seed layer 120 and the insulating layer 110. In this case, the third region 141c may also be referred to as a protruding region protruding to the outside of the via hole among the entire region of the connection portion 141.

In addition, although not specifically shown in FIG. 5, a part of the lower surface of the connection portion 141 may be positioned lower than the lower surface of the insulating layer 110. For example, a part of the lower surface of the connection portion 141 may be positioned lower than the lower surface of the seed layer 120. That is, the lower surface of the connection portion 141 may also include a protruding region protruding below the lower surface of the insulating layer 110 and the lower surface of the seed layer 120.

Hereinafter, a method of manufacturing the printed circuit board shown in FIG. 4 will be described in detail.

FIGS. 6 to 13 are views showing the method of manufacturing the printed circuit board shown in FIG. 4 in order of processes.

Figure 6:
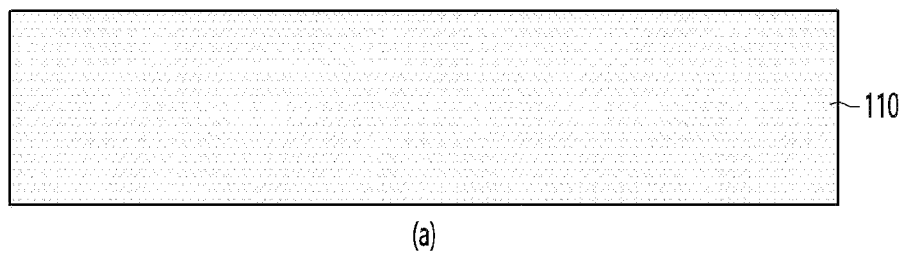
FIGS. 6 to 13 are views showing the method of manufacturing the printed circuit board shown in FIG. 4 in order of processes.
Figure 6:
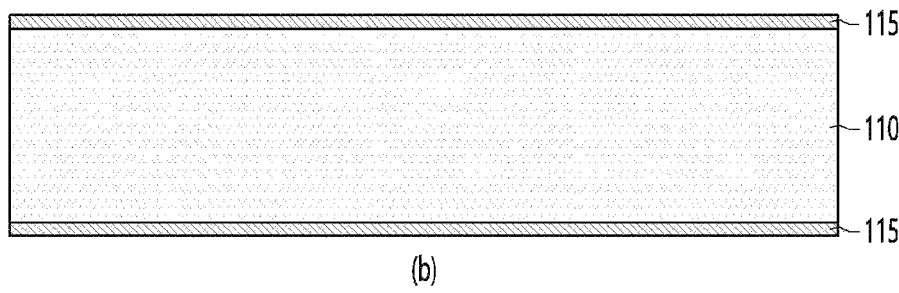

First, referring to (a) of FIG. 6, an insulating layer 110 that is the basis of a printed circuit board is prepared.

In addition, a metal layer 115 may be stacked on a surface of the insulating layer 110 as shown in (b) of FIG. 6. The metal layer 115 may be formed by electroless plating a metal including copper on the surface of the insulating layer 110. In addition, the metal layer 115 may use a copper clad laminate (CCL) unlike a case in which the metal layer 115 is formed on the insulating layer 110 by electroless plating.

Hereinafter, a method of manufacturing the printed circuit board 100 according to an embodiment with the insulating layer 110 on which the metal layer 115 is not formed will be described. However, the embodiment is not limited thereto, and when the following processes are performed while the metal layer 115 is formed as in (b) of FIG. 6, the metal layer 115 may be additionally disposed between upper and lower surfaces of the insulating layer 110 and a seed layer 120 to be described later. However, the metal layer 115 may not be disposed on an inner wall of the via hole, and only the seed layer 120 may be disposed.

Figure 7:
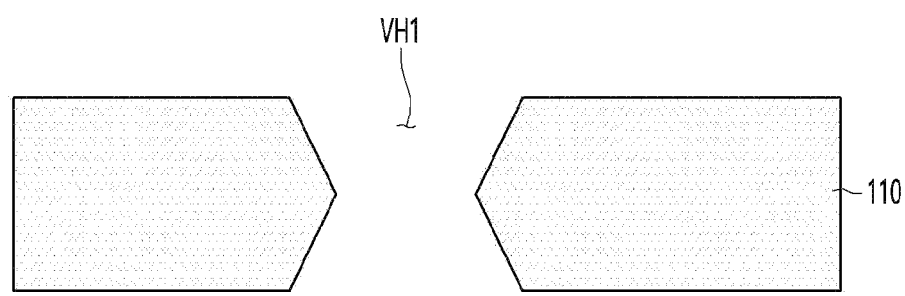

Next, referring to FIG. 7, at least one via hole VH1 may be formed in the insulating layer 110. The via hole VH1 may be formed passing through the upper and lower surfaces of the insulating layer 110. In this case, the via hole VH1 may be formed in an upper region and a lower region of the insulating layer 110, respectively. Accordingly, one via hole VH1 may be formed by a combination of a first via groove (not shown) formed in the upper region of the insulating layer 110 and a second via groove (not shown) formed in the lower region of the insulating layer 110. Accordingly, the via hole VH1 may have a shape in which a width gradually increases toward the upper side and the lower side with respect to the center thereof. For example, the via hole VH1 may have an hourglass shape.

Figure 8:
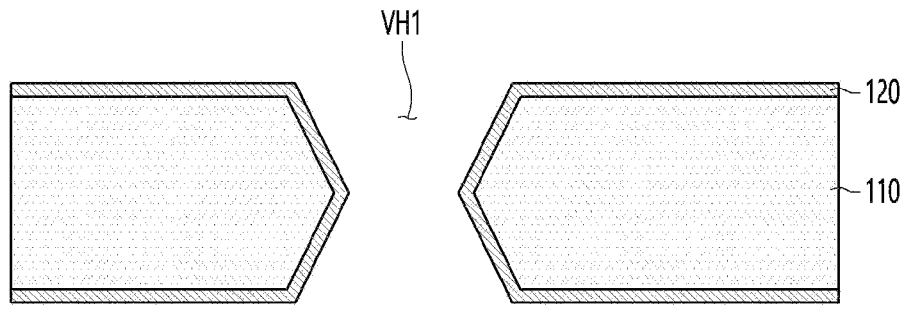

Next, as shown in FIG. 8, a process of forming the seed layer 120 on the insulating layer 110 may be performed.

The seed layer 120 may be formed on the upper surface of the insulating layer 110 and the inner wall of the via hole VH1.

The seed layer 120 may be formed on the upper surface of the insulating layer 110 and the inner wall of the via hole VH1 by a chemical copper plating method.

Figure 9:
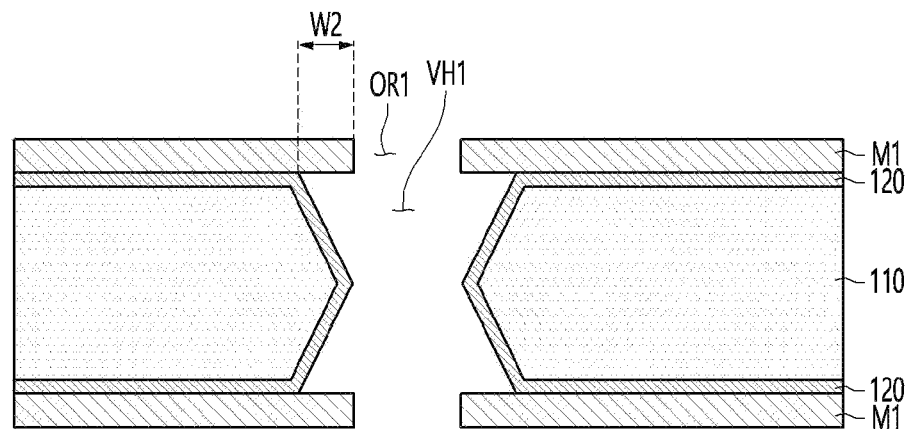

Next, as shown in FIG. 9, a process of forming a first mask M1 for forming a connection portion 141 inside the via hole VH1 may be performed.

The first mask M1 may be disposed on the seed layer 120 disposed on the upper surface of the insulating layer 110. In addition, the first mask M1 may be disposed under the seed layer 120 disposed on the lower surface of the insulating layer 110.

In addition, the first mask M1 may be disposed while covering a surface of the seed layer 120 disposed on the upper and lower surfaces of the insulating layer 110, and may include a first opening region OR1 exposing a portion in which the connection portion 141 is formed.

Preferably, the first mask M1 may include the first opening region OR1 exposing the via hole VH1. In this case, at least a part of the via hole VH1 and the first opening region OR1 may be aligned in a vertical direction.

In this case, the first opening region OR1 of the first mask M1 may expose only a partial region of the via hole VH1 rather than the entire region. That is, the first mask M1 may be disposed to cover a part of the via hole VH1.

That is, a width of the first opening region OR1 may be smaller than that of the via hole VH1.

Specifically, the first opening region OR1 of the first mask M1 disposed over the insulating layer 110 may be smaller than an upper width of the via hole VH1. Accordingly, a part of the upper region of the via hole VH1 may be exposed by the first opening region OR1, and the remaining part may be covered by the first mask M1.

In addition, the first opening region OR1 of the first mask M1 disposed under the insulating layer 110 may be smaller than a lower width of the via hole VH1. Accordingly, a part of the lower region of the via hole VH1 may be exposed by the first opening region OR1, and the remaining part may be covered by the first mask M1.

That is, the first mask M1 may include a first portion disposed on the seed layer 120 and a second portion extending from the first portion and non-contacting the seed layer 120 and the insulating layer 110. The second portion of the first mask M1 may be disposed while floating on the via hole.

In this case, a depth of a concave portion of the connection portion 141 formed in the via hole VH1 later is determined according to a width W2 of the second portion. When the width W2 of the second portion increases, a thickness of a protruding region of the connection portion 141 increases, and when the width W2 of the second portion decreases, the depth of the concave portion of the connection portion 141 increases. In addition, when the thickness of the protruding region increases, a thickness of the first pad 142 may increase correspondingly. In addition, when the depth of the concave portion increases, a dimple region may exist in the first pad 142 correspondingly. Accordingly, in the embodiment, the width W2 of the second portion is set to have a level of 5% to 20% of the upper or lower width of the via hole VH1. When the width W2 of the second portion is smaller than 5% of the upper or lower width of the via hole VH1, the dimple region may exist in the first pad 142. In addition, when the width W2 of the second portion is greater than 20% of the upper or lower width of the via hole VH1, the thickness of the protruding region of the connection portion 141 increases, and accordingly, the thickness of the first pad 142 or a thickness of the second pad 143 may increase, and further, the overall thickness of the printed circuit board 100 may increase.

In other words, the width of the first opening region OR1 may have a level of 80% to 95% of the upper or lower width of the via hole VH1.

Figure 10:
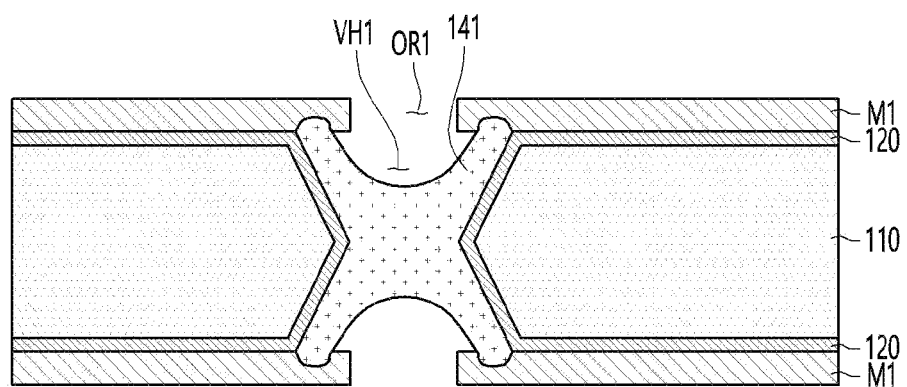

Next, referring to FIG. 10, electrolytic plating is performed on the basis of the seed layer 120 to form the connection portion 141 of the via 140 in the via hole VH1.

The connection portion 141 may be formed of any one metal material selected from copper (Cu), silver (Ag), tin (Sn), gold (Au), nickel (Ni), and palladium (Pd).

In this case, the connection portion 141 may be disposed in the via hole formed in the insulating layer 110. Preferably, the connection portion 141 may be formed by filling a part of the via hole formed in the insulating layer 110.

That is, the connection portion 141 may be formed by filling only a part of the via hole formed in the insulating layer 110, not the entire via hole.

Accordingly, the connection portion 141 may have a curved surface rather than a flat surface. Preferably, the upper surface of the connection portion 141 may have a concave shape in a downward direction. Further, the lower surface of the connection portion 141 may have a concave shape in an upward direction. Accordingly, a length of the upper surface of the connection portion 141 may be greater than the upper width of the via hole formed in the insulating layer 110. That is, the upper surface of the connection portion 141 may have a curved surface, and accordingly, the length of the upper surface of the connection portion 141 may be greater than the upper width of the via hole.

A part of the upper surface of the connection portion 141 may be positioned lower than the upper surface of the insulating layer 110. For example, the central region of the upper surface of the connection portion 141 may be positioned lower than the upper surface of the insulating layer 110. That is, the connection portion 141 may have a concave portion formed on the upper surface thereof. Accordingly, a length of the lower surface of the connection portion 141 may be larger than the lower width of the via hole formed in the insulating layer 110. That is, the lower surface of the connection portion 141 may have a curved surface, and accordingly, the length of the lower surface of the connection portion 141 may be greater than the lower width of the via hole.

In addition, a part of the lower surface of the connection portion 141 may be positioned higher than the lower surface of the insulating layer 110. For example, the central region of the lower surface of the connection portion 141 may be positioned higher than the lower surface of the insulating layer 110. That is, the connection portion 141 may have a concave portion formed on the lower surface thereof.

Accordingly, the connection portion 141 may have the concave portion formed on the upper surface and the lower surface thereof, respectively, and may have an 'X' shape as a whole.

Specifically, the via hole may include a first region positioned at the center of the insulating layer 110, a second region positioned above the insulating layer 110 on the first region, and a third region positioned below the insulating layer 110 below the first region. In addition, the entire region of the first region of the via hole may be filled by the connection portion 141. On the contrary, only a partial region of the second region and the third region of the via hole may be filled by the connection portion 141.

Meanwhile, the concave portion formed on the upper surface of the connection portion 141 may be formed to have a first depth D1 from the upper surface of the insulating layer 110. In addition, the concave portion formed on the lower surface of the connection portion 141 may be formed to have a second depth D2 from the lower surface of the insulating layer 110.

In this case, the first depth D1 may be the same as the second depth D2. For example, the first depth D1 may be 0.95 times to 1.05 times the second depth D2.

The first depth D1 may have a thickness of 5% to 40% of a thickness of the insulating layer 110. For example, the first depth D1 may have a thickness of 10% to 20% of the thickness of the insulating layer 110. When the first depth D1 is smaller than 5% of the thickness of the insulating layer 110, the thickness of the protruding region of the connection portion 141 to be described later increases, and accordingly, the thickness of the first pad 142 may be increased. In addition, when the thickness of the first pad 142 is larger than 40% of the thickness of the insulating layer 110, a dimple region may occur in a process of forming the first pad 142 later.

The second depth D2 may have a thickness of 5% to 40% of the thickness of the insulating layer 110. For example, the second depth D2 may have a thickness of 10% to 20% of the thickness of the insulating layer 110. When the second depth D2 is smaller than 5% of the thickness of the insulating layer 110, the thickness of the protruding region of the connection portion 141 to be described later increases, and accordingly, the thickness of the second pad 143 may be increased. In addition, when the thickness of the second pad 143 is larger than 40% of the thickness of the insulating layer 110, a dimple region may occur in a process of forming the second pad 143 later.

Meanwhile, the connection portion 141 may include a protruding region protruding from the surface of the insulating layer 110 and the surface of the seed layer 120. This is because the second portion of the first mask M1 is not disposed in a state of being supported on the seed layer 120 like the first portion, but is disposed in a floating form.

Accordingly, a part of the upper surface of the connection portion 141 may be positioned higher than the upper surface of the insulating layer 110. For example, a part of the upper surface of the connection portion 141 may be positioned higher than the upper surface of the seed layer 120.

In addition, a part of the lower surface of the connection portion 141 may be positioned lower than the lower surface of the insulating layer 110. For example, a part of the lower surface of the connection portion 141 may be positioned lower than the lower surface of the seed layer 120. That is, the lower surface of the connection portion 141 may also include a protruding region protruding below the lower surface of the insulating layer 110 and the lower surface of the seed layer 120.

Figure 11:
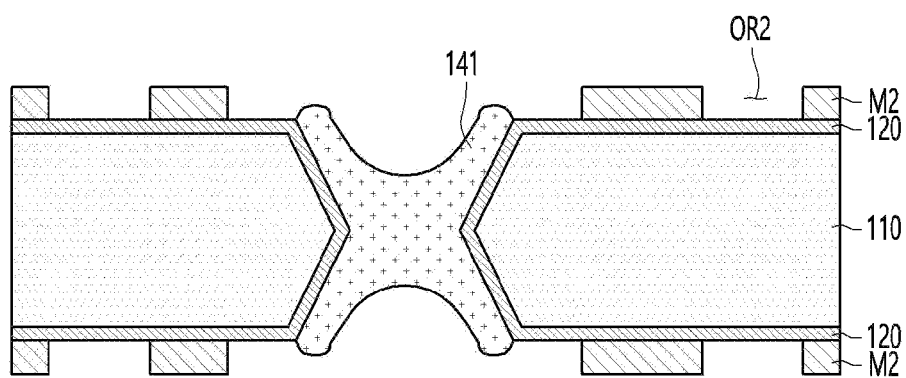

Next, referring to FIG. 11, the first mask M1 disposed on the seed layer 120 is removed. Thereafter, a second mask M2 having a second opening region OR2 exposing a region in which a circuit pattern 130, the first pad 142, and the second pad 143 are formed, is formed on the seed layer 120.

The second mask M2 may be disposed on the seed layer 120 disposed on the upper surface of the insulating layer 110, and likewise, may also be disposed below the seed layer 120 disposed on the lower surface of the insulating layer 110.

The second opening region OR2 may expose a region in which the circuit pattern 130 is formed of the upper surface of the seed layer 120.

In addition, the second opening region OR2 may expose a region in which the first and second pads 142 and 143 are formed of the upper surface of the seed layer 120.

Further, the second opening region OR2 may expose an upper region and a lower region of the connection portion 141.

Figure 12:
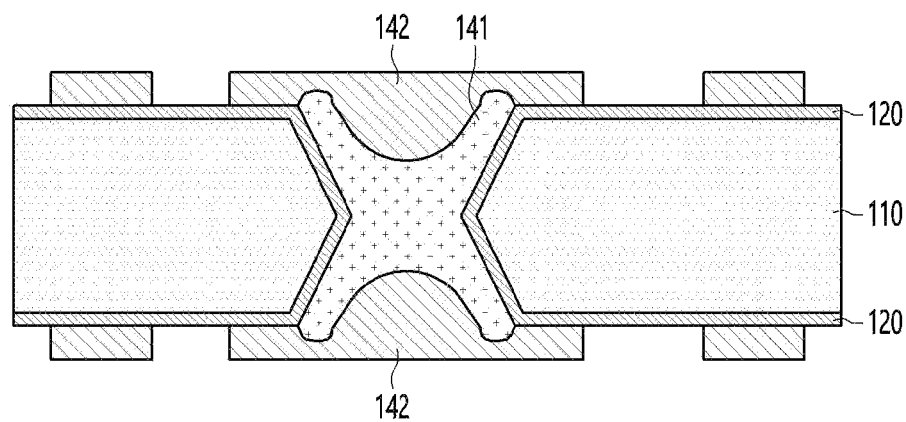

Next, referring to FIG. 12, the circuit pattern 130, the first pad 142, and the second pad 143 are formed on the seed layer 120 and the connection portion 141 exposed through the second opening region OR2 of the second mask M2.

Figure 13:
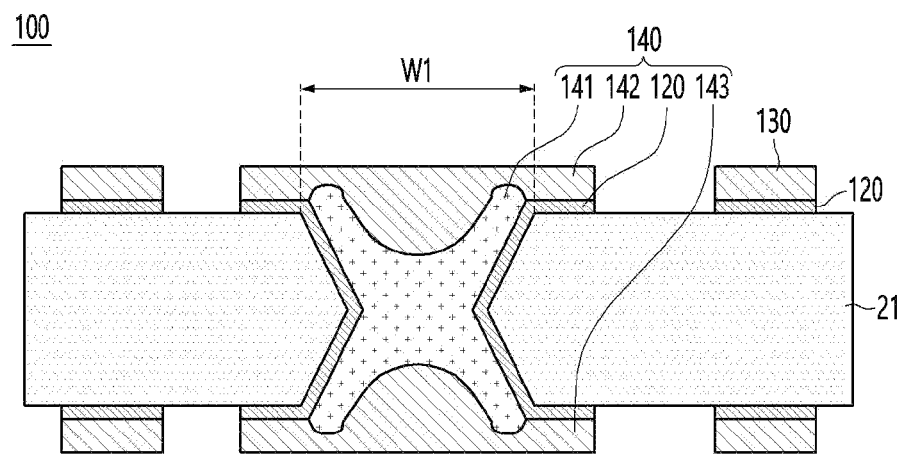

Next, as shown in FIG. 13, the second mask M2 may be removed. Thereafter, it is possible to perform a process of removing the remaining portions except for portions disposed in regions overlapping with the circuit pattern 130, the first pad 142, and the second pad 143 of the seed layer 120 disposed on the insulating layer 110.

According to the present embodiment, in case of a conventional large-area via, a restriction on plating of a large-diameter via hole occurs, but the restriction on plating the large-diameter via hole of the large-area via may be destroyed by changing a plating method, and accordingly, plating of the large-diameter via hole may be stably implemented. In addition, according to the present embodiment, it is possible to ensure uniformity of plating of a via compared to the related art, and quality reliability according to improvement of laser quality after additional lamination may be ensured.

In addition, in the related art, there was a limit ratio in a method for stably implementing of plating inside a via hole between a thickness of an insulating layer and a size of the via hole, but according to the present embodiment, it is possible to break the design constraint for implementing a highly reliable plating state inside the via hole, and accordingly, it is possible to improve the degree of freedom in design. Further, according to the embodiment, as the size of the via is increased, it is possible to completely shield the interference between circuits generated in a region in which the circuits are connected, and it is possible to improve heat dissipation characteristics in a region in which a function of heat dissipation is required.

Figure 14:
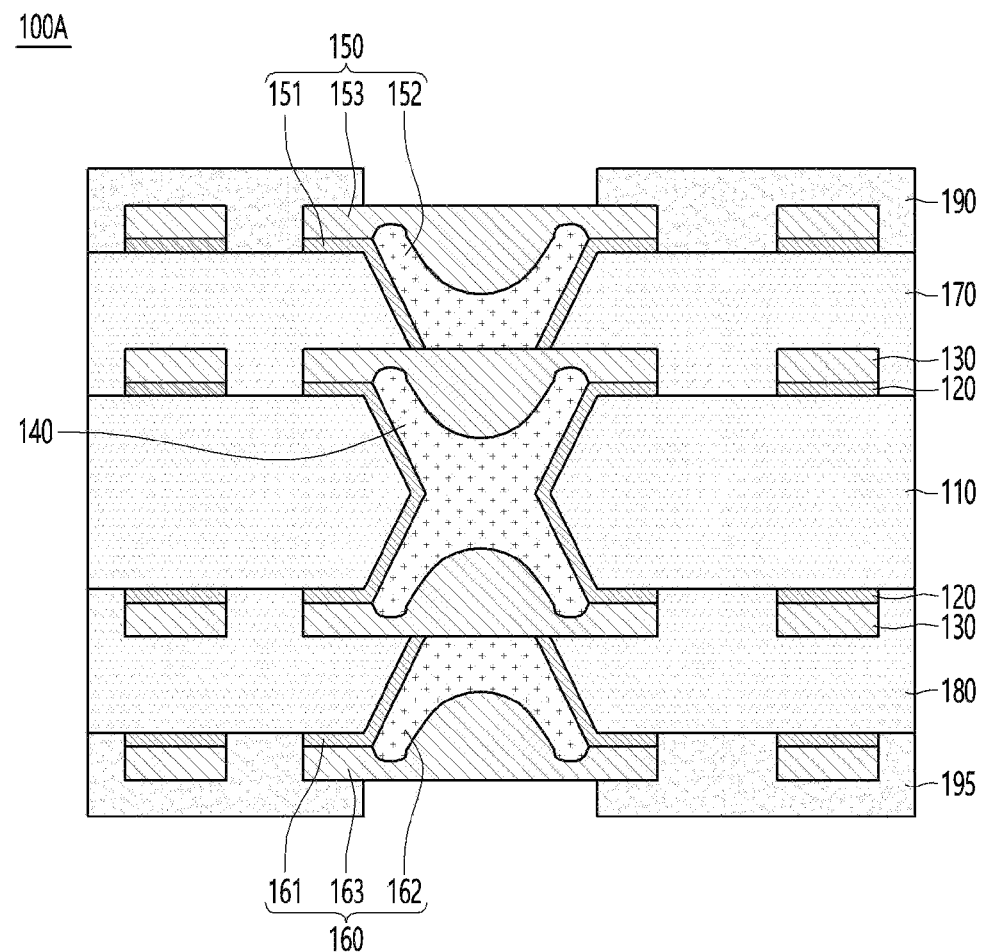
FIG. 14 is a view showing a printed circuit board according to a second embodiment.

FIG. 14 is a view showing a printed circuit board according to a second embodiment, Referring to FIG. 14, a printed circuit board 100A includes a first insulating layer 110, a second insulating layer 170, a third insulating layer 180, a first via 140, a second via 150, a third via 160, a circuit pattern 130, a seed layer 120, a first passivation layer 190, and a second passivation layer 195.

In FIG. 14, the same reference numerals are assigned to configurations that are substantially the same as those of the description of FIG. 4, and accordingly, detailed descriptions thereof will be omitted.

Referring to FIG. 14, the printed circuit board 100A has a plurality of stacked structures. The first insulating layer 110 positioned at a center of them includes the seed layer 120, the circuit pattern 130, and at least one first via 140. In addition, the at least one first via 140 includes a first pad 142, a second pad 143, and a connection portion 141.

Here, the first insulating layer 110, the seed layer 120, the circuit pattern 130, and the first via 140 have already been described with reference to FIGS. 4 and 5, and thus they will be omitted.

The second insulating layer 170 is disposed on the first insulating layer 110. In addition, the third insulating layer 180 is disposed under the first insulating layer 110.

The second insulating layer 170 may be disposed to cover the circuit pattern 130 disposed on an upper surface of the first insulating layer 110 and the first pad 142 of the first via 140.

The third insulating layer 180 may be disposed to cover the circuit pattern 130 disposed on a lower surface of the first insulating layer 110 and the second pad 143 of the first via 140.

Meanwhile, although reference numerals are not given in FIG. 14, circuit patterns may be disposed on an upper surface of the second insulating layer 170 and a lower surface of the third insulating layer 180, respectively.

The second via 150 may be disposed passing through the second insulating layer 170 in the second insulating layer 170. The second via 150 may have a lower surface connected to the circuit pattern 130 or the first pad 142 disposed on the upper surface of the first insulating layer 110.

The second via 150 may have a shape corresponding to the first via 140. However, the first via 140 is a plated through hole (PTH) via. On the contrary, the second via 150 is a blind via hole (BVH) via. Accordingly, the second via 150 may include only one pad, unlike the first via 140.

Specifically, the second via 150 may include a second seed layer 151, a second connection portion 152, and a third pad 153. A lower surface of the second connection portion 152 may be connected to the first pad 142 of the first via 140. In addition, an upper surface of the second connection portion 152 may be connected to the third pad 153.

The second connection portion 152 may be formed by filling only a part of a via hole formed in the second insulating layer 170, not the entire via hole. Accordingly, the upper surface of the second connection portion 152 may have a concave shape in a downward direction. Accordingly, a length of the upper surface of the second connection portion 152 may be greater than an upper width of the via hole formed in the second insulating layer 170. That is, the upper surface of the second connection portion 152 may have a curved surface, and accordingly, the length of the upper surface of the second connection portion 152 may be greater than an upper width of the via hole formed in the second insulating layer 170.

A part of the upper surface of the second connection portion 152 may be positioned lower than the upper surface of the second insulating layer 170. For example, the central region of the upper surface of the second connection portion 152 may be positioned lower than the upper surface of the second insulating layer 170. That is, the second connection portion 152 may have a concave portion formed on the upper surface thereof.

That is, the second connection portion 152 may have a concave part formed on the upper surface thereof, and accordingly, it may have a 'V' shape.

Specifically, the via hole formed in the second insulating layer 170 may include a first region positioned below the second insulating layer 170 and a second region positioned above the second insulating layer 170 on the first region. In addition, the entire region of the first region of the via hole formed in the second insulating layer 170 may be filled by the second connection portion 152. On the contrary, only a partial region of the second region of the via hole formed in the second insulating layer 170 may be filled by the second connection portion 152.

Meanwhile, the concave portion formed on the upper surface of the second connection portion 152 may be formed to have a predetermined depth from the upper surface of the second insulating layer 170.

The depth of the concave portion of the second connection portion 152 may have a thickness of 5% to 40% of the thickness of the second insulating layer 170. For example, the depth of the concave portion of the second connection portion 152 may have a thickness of 10% to 20% of the thickness of the second insulating layer 170. When the depth of the concave portion of the second connecting portion 152 is less than 5% of the thickness of the second insulating layer 170, the thickness of the protruding area of the second connecting portion 152 increases, and accordingly, the third pad The thickness of 153 can be increased. In addition, when the depth of the concave portion of the second connection portion 152 is greater than 40% of the thickness of the second insulating layer 170, a dimple region may exist in the third pad 152.

Meanwhile, the third pad 153 may be disposed on an upper surface of the second insulating layer 170. Preferably, a second seed layer 151 may be additionally disposed between the third pad 153 and the upper surface of the second insulating layer 170. The second seed layer 151 may be disposed between the third pad 153 and an upper surface of the second insulating layer 170. Also, the second seed layer 151 may be disposed on an inner wall of the via hole.

The lower surface of the third pad 153 may be in contact with the upper surface of the second connection portion 152. Accordingly, the lower surface of the third pad 153 may have a shape corresponding to the upper surface of the second connection portion 152. Specifically, the lower surface of the third pad 153 may be a curved surface having a curvature corresponding to the upper surface of the second connection portion 152. For example, the third pad 153 may have a convex portion corresponding to a concave portion formed on the upper surface of the second connection portion 152.

Accordingly, at least a portion of the lower surface of the third pad 153 may be positioned lower than the upper surface of the second seed layer 151. For example, a part of the lower surface of the third pad 153 may be positioned lower than the upper surface of the second insulating layer 170. For example, a part of the lower surface of the third pad 153 may be positioned lower than the upper surface of the second connection portion 152. For example, a part of the lower surface of the third pad 153 may be positioned lower than an edge of the upper surface of the second connection portion 152. Specifically, a center portion of the lower surface of the third pad 153 may be positioned lower than the edge portion of the upper surface of the second connection portion 152.

Accordingly, a part of the upper surface of the second connection portion 152 may be positioned higher than a part of the lower surface of the third pad 153. In addition, another part of the upper surface of the second connection portion 152 may be positioned lower than another part of the lower surface of the third pad 153.

The third via 160 may have a shape corresponding to the second via 150. That is, the first via 140 is a plated through hole (PTH) via. On the contrary, the second via 150 and the third via 160 are blind via hole (BVH) vias. Accordingly, the third via 160 may include only one pad so as to correspond to the second via 150.

Specifically, the third via 160 may include a third seed layer 161, a third connection portion 162, and a fourth pad 163. An upper surface of the third connection portion 162 may be connected to the second pad 143 of the first via 140.

The third connection portion 162 may be formed by filling only a part of a via hole formed in the third insulating layer 180, not the entire via hole. Accordingly, a lower surface of the third connection portion 162 may have a concave shape in an upward direction. Accordingly, a length of the lower surface of the third connection portion 162 may be greater than an upper width of the via hole formed in the third insulating layer 180. That is, the lower surface of the third connection portion 162 may have a curved surface, and accordingly, the length of the lower surface of the third connection portion 162 may be greater than a lower width of the via hole formed in the third insulating layer 180.

A part of the lower surface of the third connection portion 162 may be positioned higher than the lower surface of the third insulating layer 180. For example, the central region of the lower surface of the third connection portion 162 may be positioned higher than the lower surface of the third insulating layer 180. That is, the third connection portion 162 may have a concave portion formed on the lower surface thereof.

That is, the third connection portion 162 may have a concave portion formed on the lower surface thereof, and accordingly, it may have a 'reverse V' shape.

Specifically, the via hole formed in the third insulating layer 180 may include a first region positioned above the third insulating layer 180, and a second region positioned below the third insulating layer 180 below the first region. In addition, the entire region of the first region of the via hole formed in the third insulating layer 180 may be filled by the third connection portion 162. On the contrary, only a partial region of the second region of the via hole formed in the third insulating layer 180 may be filled by the third connection portion 162.

Meanwhile, the concave portion formed on the lower surface of the third connection portion 162 may be formed to have a predetermined depth from the lower surface of the third insulating layer 180.

The depth of the concave portion of the third connection portion 162 may have a thickness of 5% to 40% of a thickness of the third insulating layer 180. For example, the depth of the concave portion of the third connection portion 162 may have a thickness of 10% to 20% of the thickness of the third insulating layer 180. When the depth of the concave portion of the third connecting portion 162 is smaller than 5% of the thickness of the third insulating layer 180, the thickness of the protruding region of the third connecting portion 162 increases, and accordingly, the thickness of the fourth pad 163 may be increased. In addition, when the depth of the concave portion of the third connection portion 162 is greater than 40% of the thickness of the third insulating layer 180, a dimple region may exist in the fourth pad 162.

Meanwhile, the fourth pad 163 may be disposed on the lower surface of the third insulating layer 180. Preferably, the third seed layer 161 may be additionally disposed between the fourth pad 163 and the lower surface of the third insulating layer 180. The third seed layer 161 may be disposed between the fourth pad 163 and the lower surface of the third insulating layer 180. Further, the third seed layer 161 may be disposed on an inner wall of the via hole formed in the third insulating layer 180.

An upper surface of the fourth pad 163 may be in contact with the lower surface of the third connection portion 162. Accordingly, the upper surface of the fourth pad 163 may have a shape corresponding to the lower surface of the third connection portion 162. Specifically, the upper surface of the fourth pad 163 may be a curved surface having a curvature corresponding to the lower surface of the third connection portion 162. For example, the fourth pad 163 may have a convex portion corresponding to a concave portion formed on the lower surface of the third connection portion 162.

Accordingly, at least a part of the upper surface of the fourth pad 163 may be positioned higher than the lower surface of the third seed layer 161. For example, a part of the upper surface of the fourth pad 163 may be positioned higher than the lower surface of the third insulating layer 180. For example, a part of the upper surface of the fourth pad 163 may be positioned higher than the lower surface of the third connection portion 162. For example, a part of the upper surface of the fourth pad 163 may be positioned higher than an edge of the lower surface of the third connection portion 162. Specifically, a center portion of the upper surface of the fourth pad 163 may be positioned higher than the edge portion of the lower surface of the third connection portion 162.

Accordingly, a part of the lower surface of the third connection portion 162 may be positioned lower than a part of the upper surface of the fourth pad 163. In addition, another part of the lower surface of the third connection portion 162 may be positioned higher than another part of the upper surface of the fourth pad 163.

Meanwhile, a part of the upper surface of the second connection portion 152 may be positioned higher than the upper surface of the second insulating layer 170. For example, a part of the upper surface of the second connection portion 152 may be positioned higher than the upper surface of the second seed layer 151.

Preferably, a part of the upper surface of the second connection portion 152 may be positioned higher than the lower surface of the third pad 153. That is, the second connection portion 152 may include a protruding region protruding upward from the second insulating layer 170 and the second seed layer 151.

In addition, likewise, a part of the lower surface of the third connection portion 162 may be positioned lower than the lower surface of the third insulating layer 180. For example, a part of the lower surface of the third connection portion 162 may be positioned lower than the lower surface of the third seed layer 161.

Preferably, a part of the lower surface of the third connection portion 162 may be positioned lower than the upper surface of the fourth pad 163. That is, the third connection portion 162 may include a protruding region protruding downward from the third insulating layer 180 and the third seed layer 161.

According to the present embodiment, in case of a conventional large-area via, a restriction on plating of a large-diameter via hole occurs, but the restriction on plating the large-diameter via hole of the large-area via may be destroyed by changing a plating method, and accordingly, plating of the large-diameter via hole may be stably implemented. In addition, according to the present embodiment, it is possible to ensure uniformity of plating of a via compared to the related art, and quality reliability according to improvement of laser quality after additional lamination may be ensured.

In addition, in the related art, there was a limit ratio in a method for stably implementing of plating inside a via hole between a thickness of an insulating layer and a size of the via hole, but according to the present embodiment, it is possible to break the design constraint for implementing a highly reliable plating state inside the via hole, and accordingly, it is possible to improve the degree of freedom in design. Further, according to the embodiment, as the size of the via is increased, it is possible to completely shield the interference between circuits generated in a region in which the circuits are connected, and it is possible to improve heat dissipation characteristics in a region in which a function of heat dissipation is required.

What is claimed is:

1. A circuit board comprising:
   a first insulating layer including a through hole passing through an upper surface and a lower surface opposite to the upper surface;
   a first metal layer including a first portion disposed on the upper surface of the first insulating layer and a second portion disposed on an inner wall of the through hole; and
   a second metal layer disposed on the second portion of the first metal layer and including an upper surface concave with respect to the upper surface of the first insulating layer;
   wherein a horizontal width of the upper surface of the second metal layer is less than or equal to a width of an upper region of the through hole adjacent to the upper surface of the first insulating layer, and
   wherein the upper surface of the second metal layer includes a protruding portion that does not overlap the upper surface of the first insulating layer in a vertical direction and is located higher than the first portion of the first metal layer.

2. The circuit board of claim 1, wherein the horizontal width of the upper surface of the second metal layer is smaller than the width of the upper region of the through hole.

3. The circuit board of claim 1, wherein the upper surface of the second metal layer includes:
   a first region positioned lower than the upper surface of the first insulating layer; and
   a second region more adjacent to the inner wall of the through hole than is the first region and positioned higher than the upper surface of the first insulating layer.

4. The circuit board of claim 1, wherein the upper surface of the second metal layer does not overlap the upper surface of the first insulating layer in a vertical direction.

5. The circuit board of claim 1, comprising:
   a third metal layer disposed on the first portion of the first metal layer and the second metal layer; and
   wherein the third metal layer includes a lower surface vertically overlapping with the upper surface of the second metal layer and convex toward the upper surface of the second metal layer.

6. The circuit board of claim 5, wherein the lower surface of the third metal layer includes:
   a third region positioned lower than the upper surface of the first insulating layer; and
   a fourth region more adjacent to the inner wall of the through hole than is the third region and positioned higher than the upper surface of the first insulating layer.

7. The circuit board of claim 1, wherein the second metal layer includes:
   a first part adjacent to the upper surface of the first insulating layer and having a first inclination that decreases in width toward the lower surface of the first insulating layer; and
   a second part adjacent to the lower surface of the first insulating layer and having a second inclination that increases in width toward the lower surface of the first insulating layer.

8. The circuit board of claim 7, wherein the first inclination and the second inclination are inclined in different directions.

9. The circuit board of claim 1, wherein the second metal layer includes a lower surface convex with respect to the lower surface of the first insulating layer, and
   wherein a horizontal width of the lower surface of the second metal layer is less than or equal to a width of a lower region of the through hole adjacent to the lower surface of the first insulating layer.

10. The circuit board of claim 9, wherein the horizontal width of the lower surface of the second metal layer is smaller than the width of the lower region of the through hole.

11. The circuit board of claim 9, wherein the lower surface of the second metal layer includes:
   a fifth region positioned higher than the lower surface of the first insulating layer; and
   a sixth region more adjacent to the inner wall of the through hole than is the fifth region and positioned lower than the lower surface of the first insulating layer.

12. The circuit board of claim 9, wherein the lower surface of the second metal layer does not overlap the lower surface of the first insulating layer in a vertical direction.

13. The circuit board of claim 9, wherein the first metal layer includes a third portion disposed on the lower surface of the first insulating layer,
   wherein a fourth metal layer is disposed under the third portion of the first metal layer and the second metal layer; and
   wherein the fourth metal layer vertically overlaps the lower surface of the second metal layer and includes an upper surface convex toward the lower surface of the second metal layer.

14. The circuit board of claim 13, wherein the upper surface of the fourth metal layer includes:
a seventh region positioned higher than the lower surface of the first insulating layer; and
an eighth region more adjacent to the inner wall of the through hole than is the seventh region and lower than the lower surface of the first insulating layer.

15. The circuit board of claim 1, wherein a vertical distance from a lowest height of the upper surface of the second metal layer to the upper surface of the first insulating layer satisfies the range of 5% to 40% of a thickness of the first insulating layer.

16. The circuit board of claim 9, wherein a vertical distance from a highest height of the lower surface of the second metal layer to the lower surface of the first insulating layer satisfies the range of 5% to 40% of a thickness of the first insulating layer.

17. The circuit board of claim 9, comprising:
a second insulating layer disposed on the upper surface of the first insulating layer; and
a fifth metal layer vertically overlapping with the second metal layer and passing through the second insulating layer,
wherein a lower surface of the fifth metal layer is flat, and
wherein an upper surface of the fifth metal layer is concave with respect to an upper surface of the second insulating layer.

18. The circuit board of claim 9, comprising:
a third insulating layer disposed under the lower surface of the first insulating layer; and
a sixth metal layer vertically overlapping with the second metal layer and passing through the third insulating layer,
wherein an upper surface of the sixth metal layer is flat, and
wherein a lower surface of the sixth metal layer is concave with respect to a lower surface of the third insulating layer.

* * * * *